United States Patent
Song et al.

(10) Patent No.: US 7,372,081 B2
(45) Date of Patent: May 13, 2008

(54) NITRIDE LIGHT EMITTING DEVICE AND MANUFACTURING METHOD THEREOF

(75) Inventors: June-o Song, Gwangju-si (KR);
Tae-yeon Seong, Gwangju-si (KR);
Dong-seok Leem, Gwangju-si (KR)

(73) Assignees: Samsung Electronics Co., Ltd.,
Suwon-Si, Gyeonggi-Do (KR);
Gwangju Institute of Science and Technology, Buk-Gu, Gwangju-Si (KR)

( * ) Notice: Subject to any disclaimer, the term of this patent is extended or adjusted under 35 U.S.C. 154(b) by 269 days.

(21) Appl. No.: 11/002,795

(22) Filed: Dec. 3, 2004

(65) Prior Publication Data

US 2005/0139825 A1 Jun. 30, 2005

(30) Foreign Application Priority Data

Dec. 24, 2003 (KR) .................. 10-2003-0095957

(51) Int. Cl.
*H01L 33/00* (2006.01)
(52) U.S. Cl. .................. 257/99; 257/E33.064
(58) Field of Classification Search .............. 257/615, 257/E33.062, E33.063, E33.064
See application file for complete search history.

(56) References Cited

U.S. PATENT DOCUMENTS

| | | | |
|---|---|---|---|
| 6,194,743 B1 | 2/2001 | Kondoh et al. | |
| 6,642,549 B2 * | 11/2003 | Chen et al. | 257/99 |
| 2001/0015442 A1 * | 8/2001 | Kondoh et al. | 257/79 |
| 2002/0036286 A1 * | 3/2002 | Ho et al. | 257/11 |
| 2003/0190764 A1 * | 10/2003 | Lee et al. | 438/46 |
| 2004/0000671 A1 * | 1/2004 | Oh et al. | 257/79 |
| 2005/0087884 A1 * | 4/2005 | Stokes et al. | 257/778 |

OTHER PUBLICATIONS

Chinese Office Action dated Aug. 3, 2007 with English language translation.
ITO/Ag/ITO multilayer films for the application of a very low resistance transparent electrode; K.H.Choi, J.Y. Kim, Y.S. Lee, H.J. Kim, Thin Solid Fils 341 (1999) 152-155.

* cited by examiner

*Primary Examiner*—Carl W. Whitehead, Jr.
*Assistant Examiner*—Jennifer M Dolan
(74) *Attorney, Agent, or Firm*—Buchanan Ingersoll & Rooney PC

(57) ABSTRACT

A nitride LED having a laminated structure in which a substrate, a n-type cladding layer, an active layer, a p-type cladding layer, and a multi-ohmic contact layer are sequentially stacked, and a manufacturing method thereof, are provided. In the nitride LED, the multi-ohmic contact layer includes multiple layers of a first transparent film layer/silver/second transparent film layer. In the nitride LED and a manufacturing method thereof, ohmic contact characteristics with respect to the p-type cladding layer are enhanced, thereby exhibiting a good current-voltage characteristic. Also, since the transparent electrodes have a high light transmitting property, the light emitting efficiency of the device is increased.

8 Claims, 3 Drawing Sheets

NITRIDE LIGHT EMITTING DEVICE AND MANUFACTURING METHOD THEREOF

BACKGROUND OF THE INVENTION

This application claims the priority of Korean Patent Application No. 2003-95957, filed on Dec. 24, 2003, in the Korean Intellectual Property Office, the disclosure of which is incorporated herein in its entirety by reference.

1. Field of the Invention

The present invention relates to a nitride light emitting device (LED) and a manufacturing method thereof, and more particularly, to a nitride LED having an electrode structure of improved emission efficiency and enhanced driving capability and a manufacturing method thereof.

2. Description of the Related Art

Currently, transparent conductive films are used in various applications, including photoelectronic devices, displays, or energy industry.

In the field of LEDs, there has been developed a transparent conductive film electrode for smooth hole injection and high-efficiency light emission.

Currently, transparent conducting oxide (TCO), transparent conducting nitride (TCN), and the like, are most actively researched as transparent conductive film materials.

Examples of the transparent conductive oxide include indium oxide ($In_2O_3$), tin oxide ($SnO_2$), zinc oxide (ZnO), indium tin oxide (ITO), and the like, and examples of the transparent conductive nitride include titanium nitride (TiN), and the like.

These materials, however, have limitations to be employed alone as a p-type transparent electrode of a top-emitting gallium nitride based LED because they have a relatively large sheet resistance value, high light reflectivity, and a relatively small work function value.

That is to say, the above-noted transparent conductive films, which have a relatively large sheet resistance, that is, substantially 100 Ω/squ may make it difficult for a LED to perform current spreading in a horizontal direction with respect to the LED, that is, in a direction parallel to an interface surface of the LED, during film formation using PVD such as sputtering, e-beam evaporation, or a heat evaporation. In addition, the transparent conductive film makes it difficult to achieve vertical injection of holes smoothly in a vertical direction. Thus, such transparent conductive films are limited in achieving large-area, large-capacity, high brightness LEDs.

Further, the above-mentioned transparent conductive films deteriorate light emitting efficiency because they have high reflectivity with respect to light emitted from the gallium nitride based LEDs.

Next, since transparent conductive films, including indium tin oxide (ITO), titanium nitride (TiN), and the like, have a relatively small work function value, it is quite difficult to form an ohmic contact through a direct contact with p-type gallium nitride.

Finally, when transparent conductive oxide (TCO) is employed as an electrode such that it is brought into a direct ohmic contact with a gallium nitride based compound semiconductor, oxidation of gallium is likely to occur on a gallium nitride surface during formation of a film, resulting in generation of gallium oxide ($Ga_2O_3$), which is an insulating material, making it difficult to form a good ohmic-contact electrode.

Meanwhile, in achieving a LED prepared from a gallium nitride based compound semiconductor or a laser diode (LD), the structure of an electrode for forming an ohmic contact between the semiconductor and the electrode becomes quite an important factor.

Such gallium nitride based LEDs are classified as top-emitting light emitting diodes (TLEDS) and flip-chip light emitting diodes (FCLEDS).

In the TLEDS, which are currently widely used, light is emitted through an ohmic contact layer being in contact with a p-type cladding layer. In order to achieve high-brightness TLEDS, one requirement is to form a current spreading film, that is, a current spreading layer, as a good ohmic contact layer for compensating for a high level of sheet resistance of the p-type cladding layer having a low hole concentration. Therefore, it is necessary to provide for smooth hole injection, current spreading, and high light emission performance by forming a current spreading film layer having a low sheet resistance value and a high degree of light transmittance.

The known TLEDS have an electrode structure in which a nickel (Ni) layer and a gold (Au) layer are sequentially laminated on a p-type cladding layer.

The nickel/gold layer structure has good specific contact resistance in a range of about $10^{-3}$ to about $10^{-4}$ Ω° C., and is used as a semi-transparent ohmic contact layer.

When such a nickel/gold layer structure is annealed at a temperature of about 500° C. to about 600° C. under an oxygen atmosphere, nickel oxide (NiO), i.e., p-type semiconductor oxide, is formed at an interface between a gallium nitride based p-type cladding layer and a nickel layer as an ohmic contact in an island shape, thereby reducing a Schottky barrier height (SBH) and easily supplying holes as multiple carriers to a region around the p-type cladding layer.

In addition, annealing of the nickel/gold layer, followed by forming the p-type cladding layer, removes a Mg—H intermetallic compound for reactivation of increasing a magnesium dopant concentration on a gallium nitride surface, thereby increasing the concentration of effective carriers on the surface of the p-type cladding layer to $10^{18}$ or greater. The increased concentration of effective carriers is believed to cause tunneling conductance between the p-type cladding layer and the ohmic contact layer containing nickel oxide, exhibiting an ohmic conducting characteristic with low specific contact resistance.

However, the TLEDS using a semi-transparent nickel/gold film electrode is poor in light emitting efficiency due to presence of a light transmittance suppressing component, that is gold (Au), which is a limitation in achieving next-generation large capacity, high-brightness LEDs.

To increase emission of heat generated during operation of a LED and light emission efficiency, a reflective layer has been employed to radiate light through a transparent substrate made of sapphire in the FCLEDS structure, which, however, has several limitations, including high resistance due to oxidation and poor adhesion of the reflective layer.

To overcome such problems with the TLEDS or FCLEDS structure, transparent conductive oxide having better transmittance than a semi-transparent nickel/gold layer structure used for the existing p-type ohmic contact layer, e.g., ITO, has been proposed as a material for a p-type ohmic contact layer. However, although the ITO ohmic contact layer increases the output power of the LED, it requires a relatively high operation voltage, which is still a limitation as a candidate material for use in large-area, high-capacity, high-brightness LEDs.

As described above, it is quite difficult to develop a transparent electrode for establishing an ohmic contact for several reasons that follow.

First, low hole concentration and high sheet resistance of not less than $10^4$ Ω/squ of p-type gallium nitride make it difficult to form a transparent electrode.

Second, since there is no transparent electrode material having a relatively high work function value than that of p-type gallium nitride, a high schottky barrier is formed at an interface between p-type gallium nitride and the electrode, thereby making smooth hole injection difficult.

Third, most of transparent electrode materials exhibit contradictory electrical and optical characteristics and have a high degree of light transmittance, so that they typically have large sheet resistance, thereby sharply reducing a tendency of horizontal current spreading. Accordingly, a large amount of heat is generated between p-type gallium nitride and the transparent electrode, shortening the life of a device and impairing the reliability in the operation of the device.

SUMMARY OF THE INVENTION

The present invention provides a nitride LED having an electrode structure which exhibits a high light-transmitting property and having a low sheet resistance.

According to an aspect of the present invention, there is provided a nitride light emitting device (LED) having an active layer between a n-type cladding layer and a p-type cladding layer, comprising a multi-ohmic contact layer on the p-type cladding layer, wherein the multi-ohmic contact layer comprises a first transparent film layer formed on the p-type cladding layer, a metallic layer containing silver as a main component on the first transparent film layer, and a second transparent film layer formed on the metallic layer, and wherein the first transparent film layer and the second transparent film layer are formed of one selected from the group consisting of a transparent oxide, a transparent nitride, and a transparent dielectric.

The transparent oxide may be an oxide containing at least one selected from the group consisting of a binary oxide or a ternary oxide formed of oxygen and at least one element selected from the group consisting of indium (In), tin (Sn), gallium (Ga), cadmium (Cd), aluminum (Al) and vanadium (V).

The ternary oxide may be at least one selected from the group consisting of indium-nickel oxide (In—Ni—O), indium-copper oxide (In—Cu—O), indium-rhodium oxide (In—Rh—O), indium-iridium oxide (In—Ir—O), indium-ruthenium oxide (In—Ru—O), tin-nickel oxide (Sn—Ni—O), tin-copper oxide (Sn—Cu—O), tin-rhodium oxide (Sn—Rh—O), tin-iridium oxide (Sn—Ir—O), tin-ruthenium oxide (Sn—Ru—O), zinc-nickel oxide (Zn—Ni—O), zinc-copper oxide (Zn—Cu—O), zinc-rhodium oxide (Zn—Rh—O), zinc-iridium oxide (Zn—Ir—O), zinc-ruthenium oxide (Zn—Ru—O), zinc-tin oxide (Zn—Sn—O), zinc-aluminum oxide (Zn—Al—O), magnesium-indium oxide (Mg—In—O), magnesium-tin oxide (Mg—Sn—O), magnesium-zinc oxide (Mg—Zn—O), gallium-indium oxide (Ga—In—O), lanthanum-copper oxide (La—Cu—O), strontium-copper oxide (Sr—Cu—O), copper-aluminum oxide (Cu—Al—O), copper-gallium oxide (Cu—Ga—O), silver-indium oxide (Ag—In—O), silver-tin oxide (Ag—Sn—O), silver-zinc oxide (Ag—Zn—O), indium-cesium oxide (In—Ce—O), tin-antimony oxide (Sn—Sb—O), and vanadium-zinc oxide (V—Zn—O).

The transparent nitride may be formed of a nitrogen (N) and at least one selected from the group consisting of titanium (Ti), vanadium (V), chromium (Cr), zirconium (Zr), hafnium (Hf), tantalum (Ta), tungsten (W), molybdenum (Mo), and scandium (Sc), The transparent dielectric may be one selected from the group consisting of ZnS, ZnTe, ZnSe, and MgF$_2$, which is good in anti-reflectivity.

Each of the respective transparent film layers preferably has a thickness of 1 to 1000 nm.

In order to adjust electrical properties of the transparent film layer, the transparent film layer may further include a dopant. Here, the dopant is preferably an element classified as a metal in the periodic table of the elements.

The amount of the dopant added to the transparent conductive oxide is preferably in a range from 0.001 to 20 wt %.

The metal layer is preferably formed to a thickness of 1 to 20 nm.

More preferably, the nitride LED further comprises an intermediate layer between the p-type cladding layer and the first transparent film layer, the intermediate layer being formed of at least one element selected from the group consisting of nickel (Ni), cobalt (Co), Zinc (Zn), palladium (Pd), platinum (Pt), copper (Cu), iridium (Ir), and ruthenium (Ru), an alloy containing the selected element, an oxide, and a solid solution.

In forming the intermediate layer, the transparent oxide may be employed as the first and second transparent film layers, and preferred examples thereof include binary oxides, ternary oxides, and the like, the binary oxides consisting of oxygen and at least one element selected from the group consisting of indium (In), tin (Sn), gallium (Ga), cadmium (Cd), aluminum (Al), zinc (Zn), magnesium (Mg), beryllium (Be), silver (Ag), molybdenum (Mo), vanadium (V), copper (Cu), iridium (Ir), rhodium, ruthenium (Ru), tungsten (W), cobalt (Co), nickel (Ni), manganese (Mn), and lanthanum (La).

The intermediate layer is preferably formed to a thickness of 0.1 to 20 nm.

In another embodiment of the present invention, the nitride LED may further comprise a reflective layer on the multi-ohmic contact layer, the reflective layer being formed of at least one element selected from the group consisting of silver (Ag), silver oxide (AgO$_2$), aluminum (Al), zinc (Zn), magnesium (Mg), ruthenium (Ru), titanium (Ti), ruthenium (Rh), chromium (Cr), and platinum (Pt).

The reflective layer is preferably formed to a thickness of 100 to 1000 nm.

In order to prevent a multi ohmic contact layer from being damaged during annealing and packaging processes, the nitride LED may further comprise an agglomeration preventing layer on the reflective layer, the agglomeration preventing layer being formed of at least one element selected from the group consisting of nickel (Ni), zinc (Zn), magnesium (Mg), platinum (Pt), copper (Cu), palladium (Pd), chromium (Cr), and tungsten (W), an alloy containing the selected element, an oxide, a solid solution, and titanium nitride (TiN).

The agglomeration preventing layer is preferably formed to a thickness of 10 to 1000 nm.

In accordance with another aspect of the present invention, there is provided a method of manufacturing a nitride light emitting device (LED) having an active layer between a n-type cladding layer and a p-type cladding layer, the method comprising: (a) forming a multi-ohmic contact layer on a substrate by sequentially depositing a first transparent film layer, a metallic layer containing silver as a main component, and a second transparent film layer on the p-type cladding layer; and (b) annealing the resultant product of step (a), wherein the first transparent film layer and the second transparent film layer are formed of one selected from the group consisting of a transparent oxide, a transparent nitride, and a transparent dielectric.

In another embodiment of the present invention, the method may further comprising forming a reflective layer on the multi ohmic contact layer for realization of FCLEDS.

In addition, in order to prevent a multi ohmic contact layer from being damaged during annealing and packaging processes, the method may further comprise forming an agglomeration preventing layer on the reflective layer.

The annealing is preferably performed at a temperature of 20° C. to 1500° C.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, a nitride LED according to an exemplary embodiment of the present invention and a manufacturing method thereof will be described in more detail with reference to the accompanying drawings.

Like numbers refer to like elements throughout the drawings referred to in the description of the invention.

Figure 1:
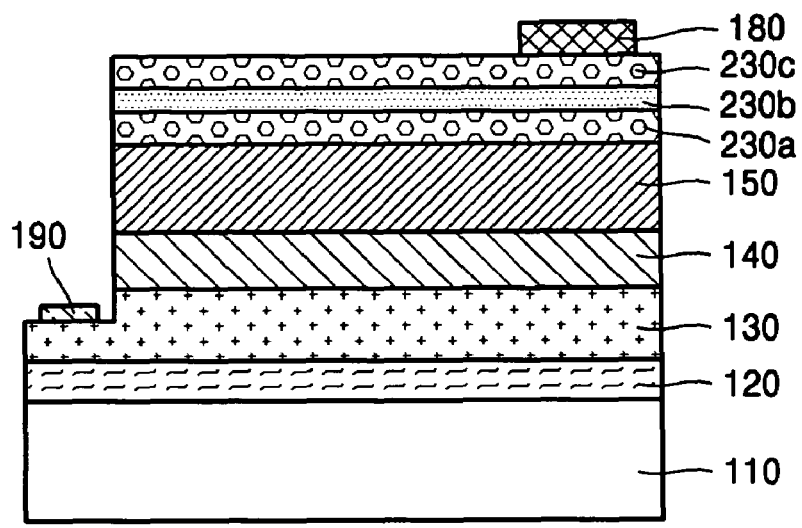
FIG. 1 is a cross-sectional view of a LED having a p-type electrode structure according to a first embodiment of the present invention.

FIG. 1 is a cross-sectional view of a LED having a p-type electrode structure according to a first embodiment of the present invention.

Referring to FIG. 1, the LED is constructed such that a substrate 110, a buffer layer 120, a n-type cladding layer 130, an active layer 140, a p-type cladding layer 150, and a multi-ohmic contact layer 230 are sequentially laminated.

Reference numeral 180 denotes a p-type electrode pad, and reference numeral 190 denotes a n-type electrode pad.

A light emitting structure consists of layers ranging from the substrate 110 to the p-type cladding layer 150, and a p-type electrode structure consists of layers laminated on the p-type cladding layer 150.

The substrate 110 is preferably formed of any one selected from the group consisting of sapphire ($Al_2O_3$), silicon carbide (SiC), silicon (Si), and gallium arsenide (GaAs).

The buffer layer 120 may not be provided on the laminated structure.

The respective layers ranging from the buffer layer 120 to the p-type cladding layer 150 are based on any one selected from compounds represented by $Al_xIn_yGa_zN$, where $0 \leq x \leq 1$, $0 \leq y \leq 1$, $0 \leq z \leq 1$, and $0 \leq x+y+z \leq 1$, corresponding to the general formula of Group ° C. nitride compounds, and the n-type cladding layer 130 and the p-type cladding layer 150 further include corresponding dopants.

The active layer 140 may be formed of a single layer or a multiple quantum well (MQW) by various known methods.

For example, when the buffer layer 120 is formed of GaN, the n-type cladding layer 130 comprises GaN, and Si, Ge, Se, or Te, added as a n-type dopant, the active layer 140 comprises InGaN/GaN MQW or AlGaN/GaN MQW, and the p-type cladding layer 150 comprises GaN, and Mg, Zn, Ca, Sr, or Ba as a p-type dopant.

A n-type ohmic contact layer (not shown) may be interposed between the n-type cladding layer 130 and the n-type electrode pad 190, and the n-type ohmic contact layer may have a variety of structures, for example, a laminated structure in which titanium (Ti) and aluminum (Al) are sequentially laminated.

The p-type electrode pad 180 may have a laminated structure of nickel (Ni)/gold (Au), or silver (Ag)/gold (Au).

The respective layers may be formed by e-beam evaporation, physical vapor deposition (PVD), chemical vapor deposition (CVD), plasma laser deposition (PLD), dual-type thermal evaporation, sputtering, and so on.

The multi-ohmic contact layer 230 has a p-type electrode structure in which a first transparent film layer 230a, a metallic layer 230b, and a second transparent film layer 230c are sequentially laminated.

The first transparent film layer 230a and the second transparent film layer 230c are formed of transparent oxide, transparent nitride, or a transparent dielectric.

According to a feature of the present invention, the transparent oxide is a binary oxide, or a ternary oxide, in which any one selected from the group consisting of indium (In), tin (Sn), gallium (Ga), cadmium (Cd), aluminum (Al), and vanadium (V), is combined with oxygen (O).

The ternary oxide may be at least one selected from the group consisting of indium-nickel oxide (In—Ni—O), indium-copper oxide (In—Cu—O), indium-rhodium oxide (In—Rh—O), indium-iridium oxide (In—Ir—O), indium-ruthenium oxide (In—Ru—O), tin-nickel oxide (Sn—Ni—O), tin-copper oxide (Sn—Cu—O), tin-rhodium oxide (Sn—Rh—O), tin-iridium oxide (Sn—Ir—O), tin-ruthenium oxide (Sn—Ru—O), zinc-nickel oxide (Zn—Ni—O), zinc-copper oxide (Zn—Cu—O), zinc-rhodium oxide (Zn—Rh—O), zinc-iridium oxide (Zn—Ir—O), zinc-ruthenium oxide (Zn—Ru—O), zinc-tin oxide (Zn—Sn—O), zinc-aluminum oxide (Zn—Al—O), magnesium-indium oxide (Mg—In—O), magnesium-tin oxide (Mg—Sn—O), magnesium-zinc oxide (Mg—Zn—O), gallium-indium oxide (Ga—In—O), lanthanum-copper oxide (La—Cu—O), strontium-copper oxide (Sr—Cu—O), copper-aluminum oxide (Cu—Al—O), copper-gallium oxide (Cu—Ga—O), silver-indium oxide (Ag—In—O), silver-tin oxide (Ag—Sn—O), silver-zinc oxide (Ag—Zn—O), indium-cesium oxide (In—Ce—O), tin-antimony oxide (Sn—Sb—O), and vanadium-zinc oxide (V—Zn—O). Here, the respective components are combined with each other in the oxide in an appropriate ratio.

The transparent nitride is in a combination of at least one metal selected from the group consisting of titanium (Ti), vanadium (V), chromium (Cr), zirconium (Zr), hafnium (Hf), tantalum (Ta), tungsten (W), molybdenum (Mo), and scandium (Sc), and nitrogen (N). The transparent dielectric is any one selected from the group consisting of ZnS, ZnTe, ZnSe, and $MgF_2$.

Materials used for the transparent film layers 230a and 230c are selected in consideration of work function and sheet resistance.

In order to improve electrical properties of transparent oxide, transparent nitride, and transparent dielectric used as main components of the transparent film layers 230a and 230c, at least one element among metal constituents shown in the periodic table of the elements may be added as a dopant.

Here, the ratio of the dopant added to impart appropriate electric properties to the transparent oxide, transparent nitride, transparent dielectric is preferably in a range of 0.001 to 20 wt %. Here, "wt %" stands for percentage by weight among elements added.

The first and second transparent film layers 230a and 230c are preferably formed to a thickness in a range of 1 nm to 1000 nm from the viewpoint of appropriate degrees of light transmittance and electric conductivity.

The metallic layer 230b is made from a material which has high electric conductivity, is easily decomposed to conductive, nano-phase particles during annealing at a temperature of not greater than 600° C. under an oxygen atmosphere, and is not liable to oxidation.

One exemplary material for the metallic layer 230b satisfying such conditions is silver (Ag).

The metallic layer 230b is preferably formed of a single substance. The metallic layer 230b may also be formed of an alloy or solid solution having silver (Ag) as a main component.

The metallic layer 230b of the multi-ohmic contact layer 230 is preferably formed to a thickness enough to be easily decomposed to conductive, nano-phase particles during annealing, that is, a thickness in a range of 1 nm to 20 nm.

The multi-ohmic contact layer 230 is preferably formed by any technique among e-beam evaporation, thermal evaporation, sputtering deposition, pulsed laser deposition, and the like.

In addition, the deposition temperature for forming the multi-ohmic contact layer 230 is preferably in a range of approximately 20° C. to approximately 1500° C., and the pressure of an evaporator is preferably in a range of atmospheric pressure to approximately $10^{-12}$ Torr.

The forming of the multi-ohmic contact layer 230 is preferably followed by annealing.

The annealing is preferably carried out at a temperature of approximately 100° C. to approximately 800° C. under vacuum or gaseous atmosphere for approximately 10 seconds to approximately 3 hours.

During annealing, at least one gas selected among nitrogen, argon, helium, oxygen, hydrogen, air, and so on may be injected into the reaction chamber.

Figure 2:
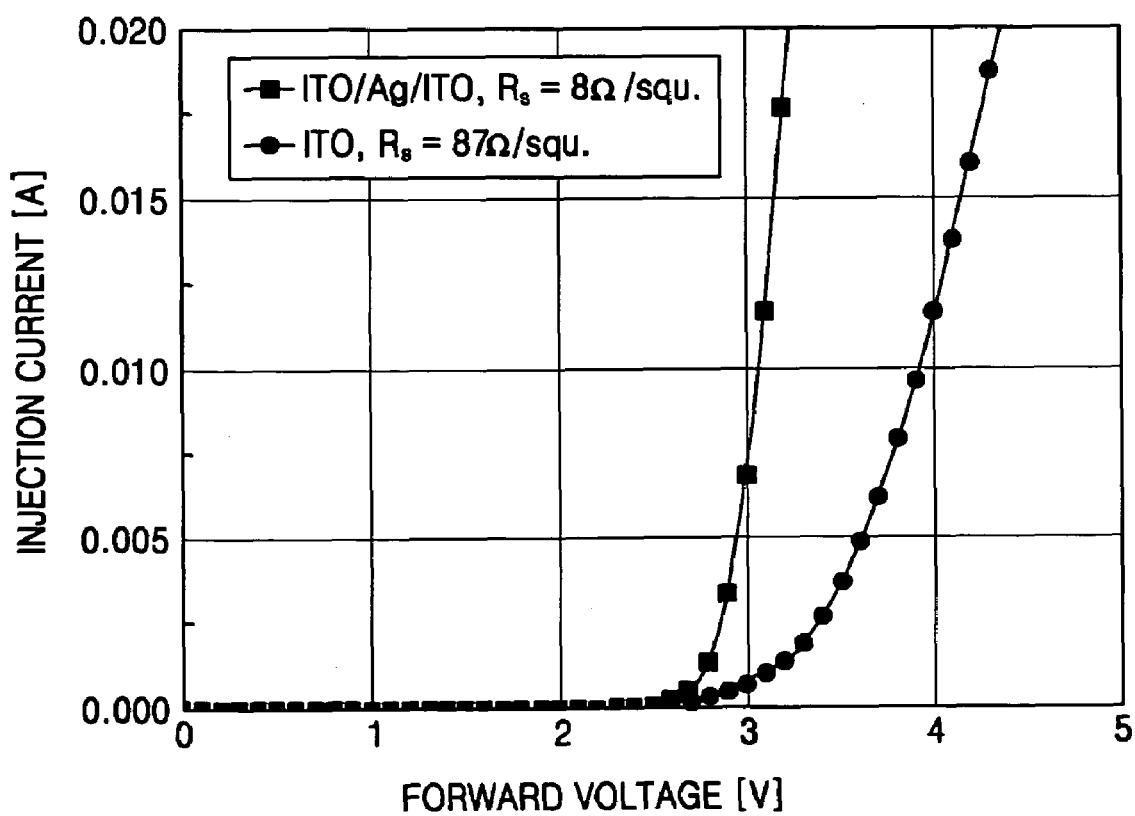
FIG. 2 is a graphical representation showing current-voltage characteristics of the p-type electrode structure according to a first embodiment of the present invention.

FIG. 2 is a graphical representation showing current-voltage characteristics of the p-type electrode structure according to a first embodiment of the present invention, in which a LED is constructed such that a first transparent film layer 230a made of indium tin oxide (ITO) is deposited on a p-type cladding layer 150, a metallic layer made of silver is deposited thereon, and a second transparent film layer 230c made of indium tin oxide (ITO) are deposited thereon, and a LED is constructed such that indium tin oxide (ITO) is formed alone on the p-type cladding layer 150 to form an ohmic contact layer.

As shown in FIG. 2, the current-voltage characteristic of the LED having the multi-ohmic contact layer 230 according to the present invention is better than that of the LED having indium tin oxide (ITO) alone.

When indium tin oxide (ITO) is used alone as an electrode material, the sheet resistance of the electrode is 87 Ω/squ. When the multi-ohmic contact layer 230 has an electrode structure of ITO/Ag/ITO, the sheet resistance thereof structure is reduced to 8 Ω/squ.

This result confirms that as the sheet resistance of a film layer used as the electrode structure becomes smaller, lateral current spreading easily occurs, suggesting that a reliable LED having high light emission efficiency is achievable.

Figure 3:
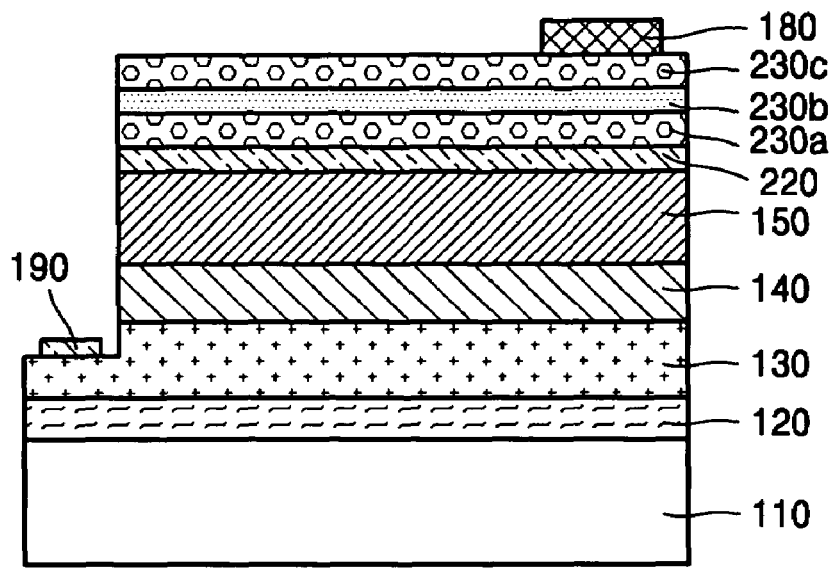
FIG. 3 is a cross-sectional view of a LED having a p-type electrode structure according to a second embodiment of the present invention.

FIG. 3 is a cross-sectional view of a LED having a p-type electrode structure according to a second embodiment of the present invention;

Referring to FIG. 3, the LED may further include an intermediate layer 220 between the multi-ohmic contact layer 230 and the p-type cladding layer 150.

Here, the p-type electrode structure includes an intermediate layer 220 and a multi-ohmic contact layer 230.

The intermediate layer 220 is formed of a material capable of increasing electric conductivity and ohmic contact characteristics between the multi-ohmic contact layer 230 and the p-type cladding layer 150 and forming gallium-associated compounds.

Preferably, the intermediate layer is formed of any one material among at least one element selected from the group consisting of nickel (Ni), cobalt (Co), Zinc (Zn), palladium (Pd), platinum (Pt), copper (Cu), iridium (Ir), and ruthenium (Ru), alloys containing the at least one selected element, oxides, and a solid solution.

Preferably, the intermediate layer 220 is formed to a thickness of 0.1 nm to 20 nm.

When the intermediate layer 220 is formed, usable examples of the transparent oxide used as the transparent film layers 230a and 230c include binary or ternary oxides formed of oxygen and at least one element selected from the group consisting of indium (In), tin (Sn), Zinc (Zn), gallium (Ga), cadmium (Cd), magnesium (Mg), beryllium (Be), silver (Ag), molybdenum (Mo), vanadium (V), copper (Cu), iridium (Ir), rhodium, ruthenium (Ru), tungsten (W), cobalt (Co), nickel (Ni), manganese (Mn), aluminum (Al), and lanthanum (La). As the ternary oxide, the oxide described with reference to FIG. 1 may be used.

Figure 4:
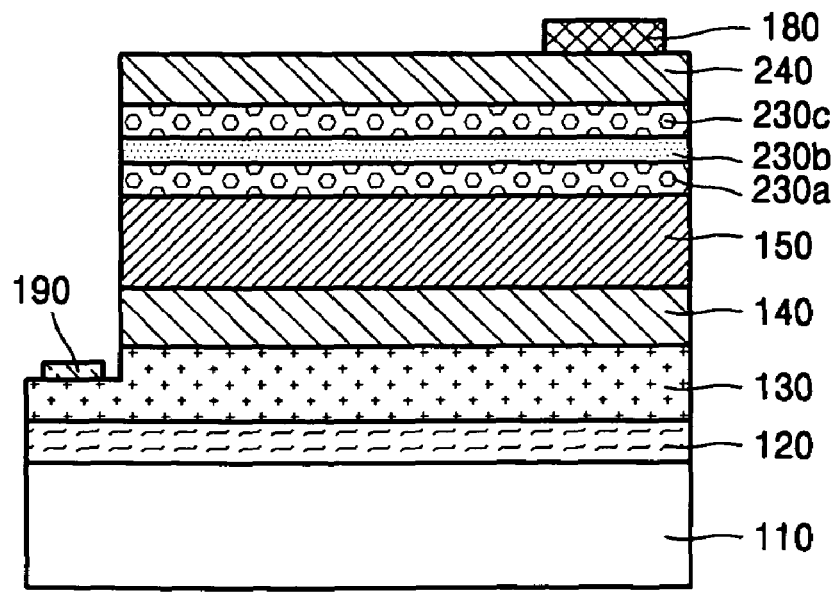
FIG. 4 is a cross-sectional view of a LED having a p-type electrode structure according to a third embodiment of the present invention.

FIG. 4 is a cross-sectional view of a LED having a p-type electrode structure according to a third embodiment of the present invention.

Referring to FIG. 4, the LED has a reflective layer 240 formed on a multi-ohmic contact layer 230.

Here, the p-type electrode structure includes the multi-ohmic contact layer 230 and the reflective layer 240.

The reflective layer 240 is used to realize FCLEDS, and preferably formed of at least one selected from the group consisting of silver (Ag), silver oxide ($Ag_2O$), aluminum (Al), Zinc (Zn), magnesium (Mg), ruthenium (Ru), titanium (Ti), ruthenium (Rh), chromium (Cr), and platinum (Pt).

The reflective layer 240 is formed to a thickness of 100 nm to 1000 nm in view of reflectivity.

In addition, the reflective layer 240 may be employed additionally to the LED shown in FIG. 3. That is, in the LED shown in FIG. 3, the reflective layer 240 may further be formed on the multi-ohmic contact layer 230 disposed on the intermediate layer 220 using the same material as described above.

Figure 5:
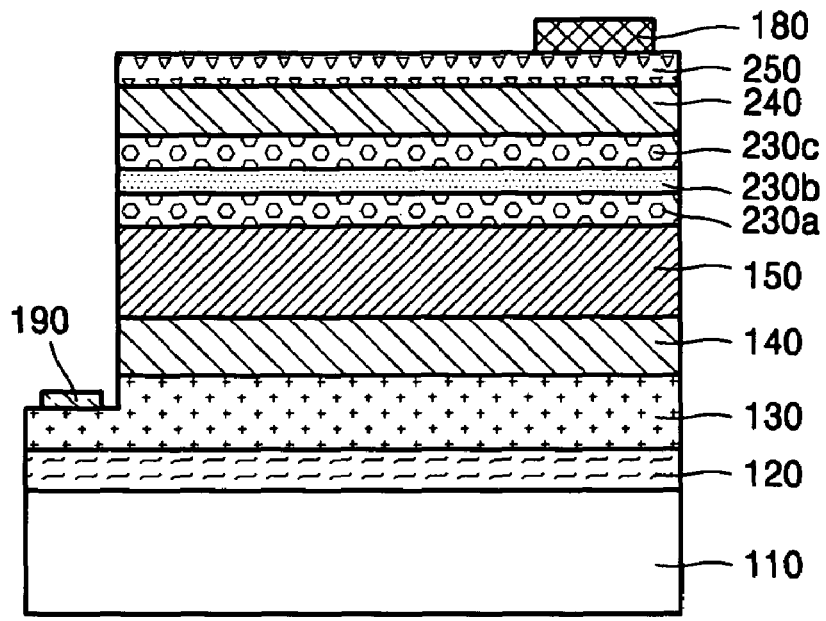
FIG. 5 is a cross-sectional view of a LED having a p-type electrode structure according to a fourth embodiment of the present invention.

FIG. 5 is a cross-sectional view of a LED having a p-type electrode structure according to a fourth embodiment of the present invention.

Referring to FIG. 5, the LED has an electrode structure in which a reflective layer 240 and an agglomeration preventing layer 250 are sequentially laminated on the multi-ohmic contact layer.

The agglomeration preventing layer 250 is employed to increase adhesiveness between the same and a p-type electrode pad 180 and to enhance durability by suppressing oxidation of the reflective layer 240.

The agglomeration preventing layer 250 is preferably formed of at least one selected from the group consisting of an element selected among nickel (Ni), Zinc (Zn), magnesium (Mg), platinum (Pt), copper (Cu), and palladium (Pd), an alloy containing the selected element, oxide, a solid solution, and titanium nitride (TiN).

The agglomeration preventing layer 250 is preferably formed to a thickness of 100 nm to 1000 nm.

Figure 6:
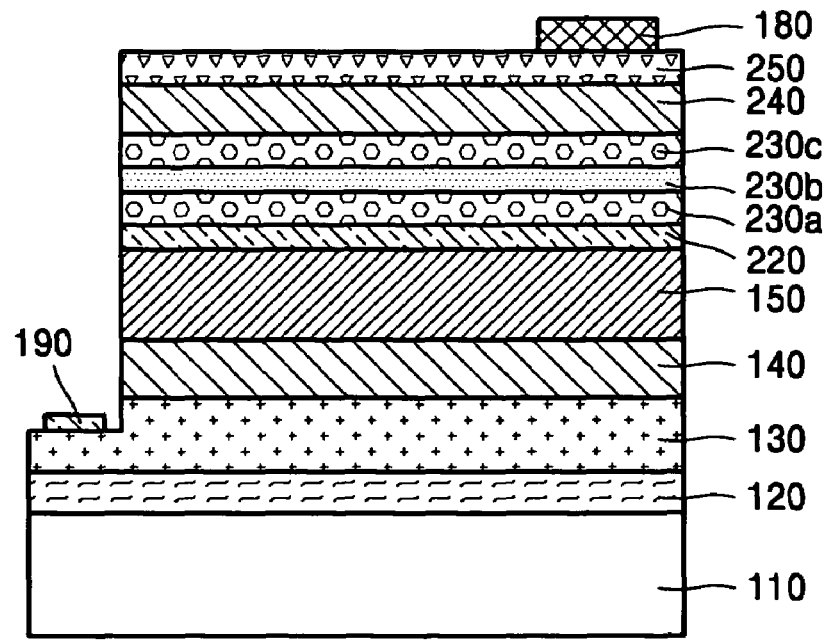
FIG. 6 is a cross-sectional view of a LED having a p-type electrode structure according to a sixth embodiment of the present invention.

FIG. 6 is a cross-sectional view of a LED having a p-type electrode structure according to a fifth embodiment of the present invention.

Referring to FIG. 6, the LED has an electrode structure in which an intermediate layer 220, a multi-ohmic contact layer 230, a reflective layer 240, and an agglomeration preventing layer 250 are sequentially laminated on a p-type cladding layer 150.

The LED illustrated in FIGS. 3 through 6 is formed by depositing each corresponding p-type electrode structure on the LED structure of multiple layers ranging from the substrate 110 to the p-type cladding layer 150 by the deposition technique described with reference to FIG. 1, followed by annealing.

Performing the annealing improves the current-voltage characteristic of the device compared to the case in which the annealing is not performed.

As described above, in the nitride LED and the manufacturing method thereof, the multi-ohmic contact layer includes multiple layers of a first transparent film layer/silver/second transparent film layer. In addition, ohmic contact characteristics with respect to the p-type cladding layer are enhanced, thereby exhibiting a good current-voltage characteristic. Also, since the transparent electrodes have a high light transmitting property, the light emitting efficiency of the device is increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nitride light emitting device (LED) comprising an active layer between a n-type cladding layer and a p-type cladding layer, and a multi-ohmic contact layer on the p-type cladding layer, wherein the multi-ohmic contact layer comprises:
    a first transparent film layer formed on the p-type cladding layer;
    a metallic layer having silver as a main component formed on the first transparent film layer; and
    a second transparent film layer formed on the metallic layer;
    wherein the first transparent film layer is formed of a transparent dielectric material and the second transparent film layer is formed of a material selected from the group consisting of a transparent oxide, a transparent nitride, and a transparent dielectric, and
    wherein at least the first transparent film has a thickness greater than 10 nm.

2. The nitride LED of claim 1, wherein the transparent oxide is an oxide containing at least one selected from the group consisting of indium (In), tin (Sn), gallium (Ga), cadmium (Cd), vanadium (V), and aluminum (Al),
    the transparent nitride is formed of a nitrogen (N), and at least one selected from the group consisting of titanium (Ti), vanadium (V), chromium (Cr), zirconium (Zr), hafnium (Hf), tantalum (Ta), tungsten (W), molybdenum (Mo), and scandium (Sc), and
    the transparent dielectric is one selected from the group consisting of ZnS, ZnTe, ZnSe, and $MgF_2$.

3. The nitride LED of claim 1, further comprising an intermediate layer between the p-type cladding layer and the first transparent film layer, the intermediate layer being formed of at least one element selected from the group consisting of nickel (Ni), cobalt (Co), Zinc (Zn), palladium (Pd), platinum (Pt), copper (Cu), iridium (Ir), and ruthenium (Ru), an alloy containing the selected element, an oxide, and a solid solution.

4. The nitride LED of claim 3, wherein the transparent oxide is formed of at least one element selected from the group consisting of indium (In), tin (Sn), gallium (Ga), cadmium (Cd), aluminum (Al), zinc (Zn), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), and lanthanum (La).

5. The nitride LED of claim 1, wherein the transparent oxide is formed of at least one element selected from the group consisting of indium (In), tin (Sn), gallium (Ga), cadmium (Cd), aluminum (Al), zinc (Zn), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), and lanthanum (La).

6. The nitride LED of claim 1, further comprising a reflective layer on the multi-ohmic contact layer, the reflective layer being formed of at least one element selected from the group consisting of silver (Ag), silver oxide ($AgO_2$), aluminum (Al), zinc (Zn), magnesium (Mg), ruthenium (Ru), titanium (Ti), ruthenium (Rh), chromium (Cr), and platinum (Pt).

7. The nitride LED of claim 6, further comprising an agglomeration preventing layer on the reflective layer, the agglomeration preventing layer being formed of at least one element selected from the group consisting of nickel (Ni), zinc (Zn), magnesium (Mg), platinum (Pt), copper (Cu), palladium (Pd), chromium (Cr), and tungsten (W), an alloy containing the selected element, an oxide, a solid solution, and titanium nitride (TiN).

8. The nitride LED of claim 7, wherein the transparent oxide is formed of at least one element selected from the group consisting of indium (In), tin (Sn), gallium (Ga), cadmium (Cd), aluminum (Al), zinc (Zn), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), and lanthanum (La).

* * * * *